(12) United States Patent
Harvey et al.

(10) Patent No.: US 11,280,862 B2
(45) Date of Patent: Mar. 22, 2022

(54) MAGNETIC RESONANCE IMAGING SYSTEM WITH EMERGENCY QUENCH

(71) Applicant: KONINKLIJKE PHILIPS N.V., Eindhoven (NL)

(72) Inventors: Paul Royston Harvey, Best (NL); Eric Jean, Woburn, MA (US); Theo Jenneskens, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 290 days.

(21) Appl. No.: 16/610,935

(22) PCT Filed: May 8, 2018

(86) PCT No.: PCT/EP2018/061857
§ 371 (c)(1),
(2) Date: Nov. 5, 2019

(87) PCT Pub. No.: WO2018/206570
PCT Pub. Date: Nov. 15, 2018

(65) Prior Publication Data
US 2020/0057126 A1 Feb. 20, 2020

Related U.S. Application Data

(60) Provisional application No. 62/502,829, filed on May 8, 2017.

(30) Foreign Application Priority Data

May 22, 2017 (EP) ..................................... 17172126

(51) Int. Cl.
*H01F 6/02* (2006.01)
*G01R 33/3815* (2006.01)

(52) U.S. Cl.
CPC ............ *G01R 33/3815* (2013.01); *H01F 6/02* (2013.01)

(58) Field of Classification Search
CPC ........ G01R 33/3815; H01F 6/02; H02H 7/001
See application file for complete search history.

(56) References Cited

U.S. PATENT DOCUMENTS

2005/0248350 A1* 11/2005 Tsuda ................. G01R 33/3815
324/322
2007/0024404 A1 2/2007 Westphal et al.
(Continued)

FOREIGN PATENT DOCUMENTS

| CN | 104753027 A | 7/2015 |
|---|---|---|
| JP | 1291852 A | 11/1989 |

OTHER PUBLICATIONS

International Search Report and Written Opinion from PCT/EP2018/061857 dated Jul. 23, 2018.
(Continued)

*Primary Examiner* — Ramon M Barrera

(57) ABSTRACT

The invention relates to a magnetic resonance imaging (MRI) system with emergency quench. According to the invention, a magnetic resonance imaging system (1) comprising a superconductive magnet (2) with windings (3) for generating a magnetic field, an emergency button (4) and a circuitry logic (5) for controlling the magnet (2) coupled to the magnet (2) and to the emergency button (4), wherein the magnet (2) is operable in a superconducting state and in a normal conductivity state, respectively, and the emergency button (4) and the circuitry logic (5) are configured in such a way that, when the magnet (2) is operated in the superconducting state, actuating the emergency button (4) by a user in a predefined first way initiates ramping down the magnetic field while dissipating energy stored in the windings (3) of the magnet (2) to an external dissipation device
(Continued)

(6), and actuating the emergency button (4) by a user in a predefined second way which is different from the first way initiates quenching the magnetic field by heating up at least part of the windings (3) of the magnet (2) leading to a dissipation of energy stored in the windings (3) of the magnet (2) as additional heat to the magnet (2). In this way, an easy and reliable way to control a superconductive magnet (2) of an MRI system (1) is provided in an event in which the magnetic field has to be removed.

14 Claims, 2 Drawing Sheets

(56) References Cited

U.S. PATENT DOCUMENTS

| | | | |
|---|---|---|---|
| 2010/0284120 A1 | 11/2010 | Beier | |
| 2015/0255977 A1 | 9/2015 | Jonas et al. | |
| 2017/0261574 A1 | 9/2017 | Stainsby et al. | |
| 2017/0269175 A1* | 9/2017 | Steckner | G08B 21/02 |

OTHER PUBLICATIONS

Anonymous "Achieva Release 3.2 Series Instructions for Use" Philips Healthcare Nederland, Aug. 2012 p. 1-166.

* cited by examiner

MAGNETIC RESONANCE IMAGING SYSTEM WITH EMERGENCY QUENCH

CROSS REFERENCE TO RELATED APPLICATIONS

This application is a U.S. national phase application of International Application No. PCT/EP2018/061857 filed on May 8, 2018, which claims the benefit of EP Application Serial No. 17172126.9 filed May 22, 2017 and U.S. Application Ser. No. 62/502,829 filed on May 8, 2017 and is incorporated herein by reference.

FIELD OF THE INVENTION

The invention relates to a magnetic resonance imaging system comprising a superconductive magnet with windings for generating a magnetic field, an emergency button and a circuitry logic coupled to the magnet and to the emergency button for controlling the magnet, and to a method and a non-transitory computer-readable medium for controlling the operation of a superconductive magnet of a magnetic resonance imaging system.

BACKGROUND OF THE INVENTION

For magnetic resonance imaging (MRI) systems with a superconducting magnet, there is the possibility to ramp down the magnetic field of the magnet while dissipating the energy stored in the magnet to an external dissipation device like an electrical load. This may prevent the magnet from "warming up" and allows almost immediate re-ramp without an additional cooling period or significant loss of the cryogen for the magnet, typically liquid helium.

Further, practically all superconducting magnets of MRI systems include a quench capability which provides for rapid removal of the magnetic field in case of an emergency. Typically, superconducting MRI systems are provided with one or more quench buttons that the user can press in the event of an emergency. In case of a quench, parts of the normally superconducting windings of the magnet are intentionally heated up resulting in conversion of the superconductor to normal conductivity state. This state spreads rapidly throughout the magnet and the energy stored in the magnet is dissipated as heat in the magnet conductors and internal structure. If the magnet contains liquid helium as a cryogen, this helium is typically boiled off and expelled from the magnet. During a quench the magnet conductors warm up and requires significant extra time to cool down before the magnetic field can be ramped up again. Therefore, a quench is a costly and time consuming event.

However, it is not necessary in every emergency to quench the magnet and a somewhat slower controlled ramp down as explained further above will be just as effective. Accordingly, in such cases it is beneficial to ramp down the magnet and dissipate the energy external to the magnet so that, once the emergency has been addressed, the magnet can be rapidly ramped up again.

A superconducting magnet is an electromagnet made from coils/windings of superconducting wire. The coils must be cooled to cryogenic temperatures during operation in order to achieve superconductivity. In its superconducting state the wire has essentially zero resistance and a current injected into the wire will flow without dissipation. When the ends of a current carrying superconducting wire loop are closed (connected), the current continues to flow without (or with extremely slow) decay. The superconductive state allows for currents to flow persistently with "zero" dissipation and without the need of an external power supply. An ordinary conducting wire can also carry a large current (depending on thickness), but it also creates a lot of heat and is impractical for high field MRI applications. The superconducting wire enables compact magnets with high magnetic fields and no need for continuous supply of external energy to maintain the field. Therefore, superconducting magnets are used in MRI systems in hospitals where very strong magnetic fields are required for the examination of the human body.

During operation, the magnet coil must be cooled below its critical temperature, i.e. the temperature at which the winding material changes from the normal resistive state and becomes a superconductor. Two types of cooling are commonly used to maintain magnet windings at temperatures sufficient to maintain superconductivity, i.e. liquid cooling or mechanical cooling. When liquid cooling is applied, typically liquid helium is used as a cryogen. However, some superconducting systems can also be cooled using two stage mechanical refrigeration.

Superconducting magnets with liquid cooling which recondense the helium gas back to liquid helium are often referred to as zero boil-off (ZBO) magnets. The helium gas formed by the boiling of liquid helium in the superconducting magnet helium pressure vessel is flowed through passageways in a recondenser cooled by a cryocooler to recondense the helium gas back to liquid helium for return to the liquid helium bath in the pressure vessel.

SUMMARY OF THE INVENTION

It is an object of the invention to provide for an easy and reliable way to control a superconductive magnet of an MRI system in an event in which the magnetic field has to be removed.

This object is addressed by the subject matter of the independent claims. Preferred embodiments are described in the sub claims.

Therefore, according to the invention, a magnetic resonance imaging (MRI) system is provided comprising a superconductive magnet with windings for generating a magnetic field, an emergency button and a circuitry logic coupled to the magnet and to the emergency button for controlling the magnet, wherein the magnet is operable in a superconducting state and in a normal conductivity state, respectively, and the emergency button and the circuitry logic are configured in such a way that, when the magnet is operated in the superconducting state, actuating the emergency button by a user in a predefined first way initiates ramping down the magnetic field while dissipating energy stored in the windings of the magnet to an external dissipation device, and actuating the emergency button by the user in a predefined second way which is different from the first way initiates quenching the magnetic field by heating up at least part of the windings of the magnet leading to a dissipation of energy stored in the windings of the magnet as additional heat to the magnet.

Thus, the invention provides for the possibility that, in the event of an emergency or otherwise, the user of the MRI system may rapidly choose between an immediate quench of the magnet or a controlled ramp down the latter having the advantage that there is little risk of damage to the magnet and that, once the emergency has been addressed, the magnet can be rapidly ramped up again. According to a preferred embodiment of the invention, this choice is made according to the number of times the emergency button is actuated as set out below in further detail.

The invention is generally applicable to all superconducting magnet types including both ZBO and so-called sealed or helium free magnets. In ZBO magnets quenching the magnet involves still the uncontrolled evaporation of liquid helium. Moreover in both ZBO magnets and helium free magnets quenching causes the magnetic energy stored in the coil windings to de dissipated. This would heat-up the coil windings and before the magnet could be ramped up again, the magnet windings need to be cooled again which may take several hours or even several days. The controlled heating of the coil windings may also cause mechanical damage to the coil windings and their support structure. It can also be retro-fitted to existing MRI systems when provision is also made to enable controlled ramp down of the magnet with energy dissipation external to the magnet.

If according to a preferred embodiment of the invention, a cryogen for cooling the magnet is provided for achieving the superconducting state of the magnet, actuating the emergency button by the user in the first way initiates ramping down the magnetic field while avoiding boiling off the cryogen, and actuating the emergency button by the user in the second way initiates quenching the magnetic field while at least partially boiling off the cryogen.

For actuating the emergency button by the user in the first way and for actuating the emergency button by the user in the second way, in general, a lot of different types of user actions are possible, respectively. While the button can be actuated totally differently in the first way and the second way, respectively, according to a preferred embodiment of the invention, actuating the emergency button by the user in the first way is a first user action, and actuating the emergency button by the user in the second way comprises a combination of the first user action and a second user action. This means that according to this preferred embodiment of the invention, the second way of actuating the emergency button comprises at least twice the first user action. However the first user action can also be repeated multiple times or another user action is added. Preferably, the second user action is a repetition of the first user action within a predetermined period of time.

Further, actuating the button may comprise touching, turning or tilting the emergency button in different ways. However, according to a preferred embodiment of the invention, actuating the emergency button by the user in the first way is a single pressing action, and actuating the emergency button by the user in the second way is a double pressing action with a first pressing action and a second pressing action, the second pressing action occurring within a predetermined period of time after the first pressing action. This method makes it very easy to shut down the MRI system reliably in the intended way.

The invention also relates to a method for controlling the operation of a superconductive magnet of a magnetic resonance imaging system, the magnet being operable in a superconducting state and in a normal conductivity state, respectively, and comprising windings for generating a magnetic field, and the magnetic resonance imaging system comprising an emergency button, the method comprising the following steps:

operating the magnet in the superconducting state, and in reaction to actuating the emergency button by a user in a predefined first way ramping down the magnetic field while dissipating energy stored in the windings of the magnet to an external dissipation device, or in reaction to actuating the emergency button by a user in a predefined second way which is different from the first way initiates quenching the magnetic field by heating up at least part of the windings of the magnet leading to a dissipation of energy stored in the windings of the magnet as additional heat to the magnet.

Moreover, the invention also pertains to a non-transitory computer-readable medium for controlling the operation of a superconductive magnet of a magnetic resonance imaging system, the magnet being operable in a superconducting state and in a normal conductivity state, respectively, and comprising windings for generating a magnetic field, and the magnetic resonance imaging system comprising an emergency button, the non-transitory computer-readable medium comprising instructions stored thereon, that when executed on a processor, perform the steps of:

operating the magnet in the superconducting state, and in reaction to actuating the emergency button by a user in a predefined first way ramping down the magnetic field while dissipating energy stored in the windings of the magnet to an external dissipation device, or in reaction to actuating the emergency button by a user in a predefined second way which is different from the first way initiates quenching the magnetic field by heating up at least part of the windings of the magnet leading to a dissipation of energy stored in the windings of the magnet as additional heat to the magnet.

The preferred embodiments described further above similarly apply to the method and the non-transitory computer-readable medium for controlling the operation of a superconductive magnet of a magnetic resonance imaging system, respectively.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
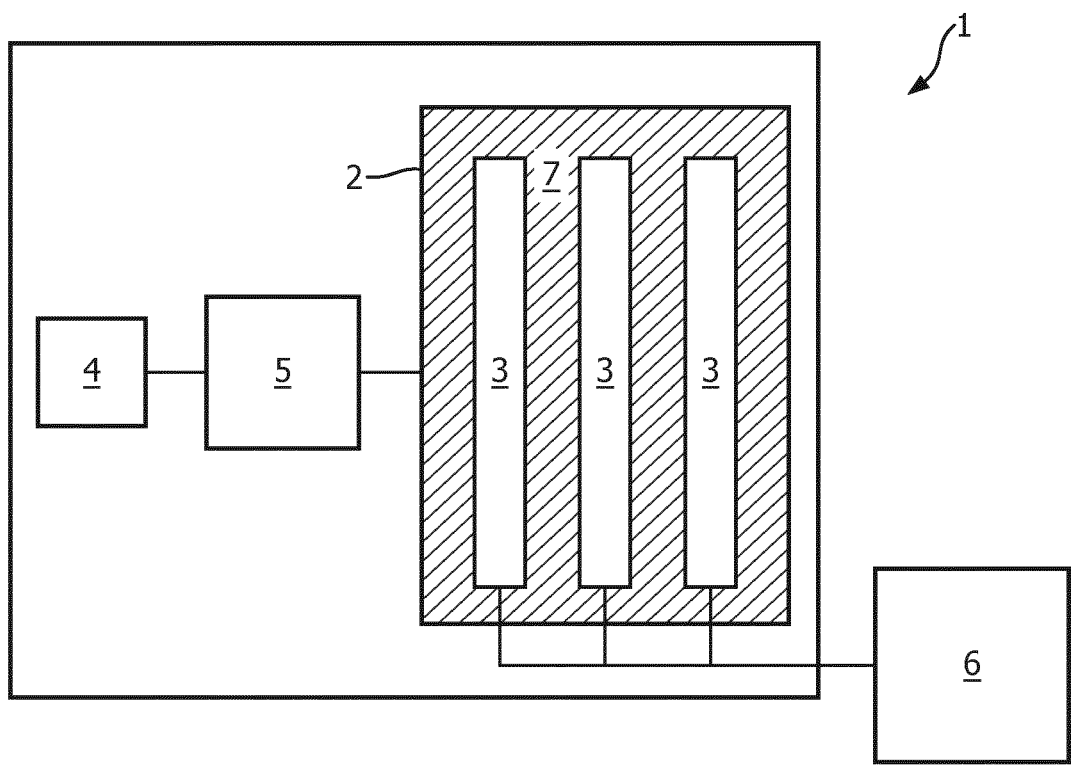
FIG. 1 schematically depicts an MRI system according to a preferred embodiment of the invention.

As schematically depicted in FIG. 1, according to a preferred embodiment of the invention, a magnetic resonance imaging system 1 comprising a superconductive magnet 2 with windings 3 for generating a magnetic field, an emergency button 4 and a circuitry logic 5 coupled to the magnet and to the emergency button for controlling the magnet 2 is provided. The magnet 2 can be operated in a superconducting state and in a normal conductivity state, respectively. In the situation depicted in FIG. 1, the magnet 2 is operated in its superconducting state which is required for a regular operation of the MRI system 1. Therefor, the windings 3 for the magnet 2 are cooled by a cryogen 7, which is liquid helium according to the present embodiment of the invention. In case that it comes to boiling off of the helium, an emergency outlet pipe 8 is provided in order to emit excess helium gas to the atmosphere. Further, as an external dissipation device 6 an electrical load is provided which can be used to dissipate heat generated in the windings 3 of the magnet 2 when the magnet 2 is ramped down in a controlled way.

According to the preferred embodiment of the invention, the emergency button 4 and the circuitry logic 5 are configured in such a way that actuating the emergency button 4 in a first way or in a second way, respectively, leads to different results. The emergency button 4 is designed in such a way that it is installed in the reach of a user of the MRI system 1 and can be actuated by a pressing action, e.g. with the palm of a hand.

Figure 2:
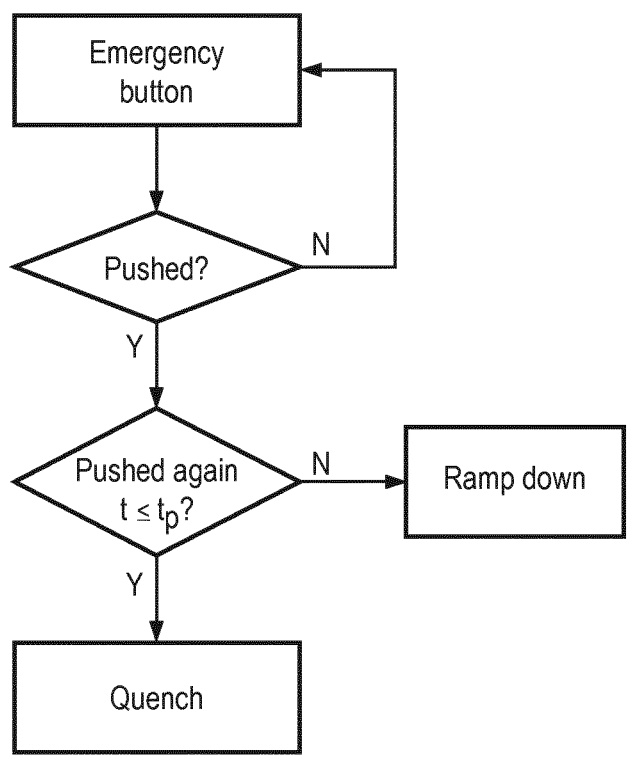
FIG. 2 depicts a flow chart of a method according to the preferred embodiment of the invention.

As depicted in the flow chart of FIG. 2, it is determined whether the emergency button 4 is pushed or not, i.e. whether a first pushing action is determined. If such a first pushing action is determined, is further checked whether a second pushing action is determined within a predetermined time $t_p$ after the first pushing action. If this is not the case, i.e. if the user has actuated the emergency button 4 with a single pushing action, a regular and controlled ramping down of the magnetic field of the magnet 2 is performed. This means that the energy stored in the windings 3 of the magnet 2 are dissipated to the external dissipation device 6 and, thus, "warming-up" of the magnet 2 is avoided. However, if instead a second pushing action is determined within a predetermined time $t_p$ after the first pushing action, i.e. if the user has actuated the emergency button 4 with a double pushing action, an immediate quench of the magnetic field of the magnet 2 is initiated. This means that at least part of the windings 3 of the magnet 2 are heated up leading to a dissipation of energy stored in the windings 3 of the magnet 2 as additional heat to the magnet 2. Though this has the disadvantage that during this procedure the magnet 2 might be damaged and additional time is required for cooling the magnet 2 before it is possible to ramp it up again, in this way the magnetic field can be removed very quickly in a hazardous situation.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

1 MRI system
2 magnet
3 windings of the magnet
4 emergency button
5 circuitry logic
6 external dissipation device
7 cryogen

The invention claimed is:

1. Magnetic resonance imaging system comprising a superconductive magnet with windings for generating a magnetic field, an emergency button and a circuitry logic for controlling the magnet coupled to the magnet and to the emergency button, wherein the magnet is operable in a superconducting state and in a normal conductivity state, respectively, and the emergency button and the circuitry logic are configured in such a way that, when the magnet is operated in the superconducting state, actuating the emergency button by a user in a predefined first way initiates ramping down the magnetic field while dissipating energy stored in the windings of the magnet to an external dissipation device, and actuating the emergency button by a user in a predefined second way which is different from the first way initiates quenching the magnetic field by heating up at least part of the windings of the magnet leading to a dissipation of energy stored in the windings of the magnet as additional heat to the magnet.

2. Magnetic resonance imaging system according to claim 1, wherein a cryogen for cooling the magnet is provided for achieving the superconducting state of the magnet, and actuating the emergency button by the user in the first way initiates ramping down the magnetic field while avoiding boiling off the cryogen, and actuating the emergency button by the user in the second way initiates quenching the magnetic field while at least partialy boiling off the cryogen.

3. Magnetic resonance imaging system according to claim 1, wherein actuating the emergency button by the user in the first way is a first user action, and actuating the emergency button by the user in the second way comprises a combination of the first user action and a second user action.

4. Magnetic resonance imaging system according to claim 3, wherein the second user action is a repetition of the first user action within a predetermined period of time.

5. Magnetic resonance imaging system according to claim 1, wherein actuating the emergency button by the user in the first way is a single pressing action, and actuating the emergency button by the user in the second way is a double pressing action with a first pressing action and a second pressing action, the second pressing action occurring within a predetermined period of time after the first pressing action.

6. Method for controlling the operation of a superconductive magnet of a magnetic resonance imaging system, the magnet being operable in a superconducting state and in a normal conductivity state, respectively, and comprising windings for generating a magnetic field, and the magnetic resonance imaging system comprising an emergency button which can be activated a predefined first and second way, the method comprising the following steps:

operating the magnet in the superconducting state, and in reaction to actuating the emergency button by a user in said predefined first way ramping down the magnetic field while dissipating energy stored in the windings of the magnet to an external dissipation device, or in reaction to actuating the emergency button by a user in said predefined second way which is different from the first way quenching the magnetic field by heating up at least part of the windings of the magnet leading to a dissipation of energy stored in the windings of the magnet as additional heat to the magnet.

7. Method according to claim 6, wherein the magnet is cooled by a cryogen for achieving the superconducting state of the magnet, and in reaction to actuating the emergency button by the user in the first way ramping down the magnetic field while avoiding boiling off the cryogen, or in reaction to actuating the emergency button by the user in the second way quenching the magnetic field while at least partialy boiling off the cryogen.

8. Method according to claim 6, wherein actuating the emergency button by the user in the first way is a first user action, and actuating the emergency button by the user in the second way comprises a combination of the first user action and second user action.

9. Method according to claim 8, wherein the second user action is a repetition of the first user action within a predetermined period of time.

10. Method according to claim 6, wherein actuating the emergency button by the user in the first way is a single pressing action, and actuating the emergency button by the user in the second way is a double pressing action with a first pressing action and a second pressing action, the second pressing action occurring within a predetermined period of time after the first pressing action.

11. A non-transitory computer-readable medium for controlling the operation of a superconductive magnet of a magnetic resonance imaging system, the magnet being operable in a superconducting state and in a normal conductivity state, respectively, and comprising windings for generating a magnetic field, and the magnetic resonance imaging system comprising an emergency button, the non-transitory computer-readable medium comprising instructions stored thereon, that when executed on a processor, perform the steps of:

operating the magnet in the superconducting state, and in reaction to actuating the emergency button by a user in a predefined first way ramping down the magnetic field while dissipating energy stored in the windings of the magnet to an external dissipation device, or in reaction to actuating the emergency button by a user in a predefined second way which is different from the first way quenching the magnetic field by heating up at least part of the windings of the magnet leading to a dissipation of energy stored in the windings of the magnet as additional heat to the magnet.

12. Non-transitory computer-readable medium according to claim 11, wherein actuating the emergency button by the user in the first way is a first user action, and actuating the emergency button by the user in the second way comprises a combination of the first user action and a second user action.

13. Non-transitory computer-readable medium according to claim 11, wherein the second user action is a repetition of the first user action within a predetermined period of time.

14. Non-transitory computer-readable medium according to claim 11, wherein actuating the emergency button by the user in the first way is a single pressing action, and actuating the emergency button by the user in the second way is a double pressing action with a first pressing action and a second pressing action, the second pressing action occurring within a predetermined period of time after the first pressing action.

* * * * *